(12) United States Patent
Zubrzycki et al.

(10) Patent No.: US 6,365,428 B1
(45) Date of Patent: Apr. 2, 2002

(54) EMBEDDED HIGH-CONTRAST DISTRIBUTED GRATING STRUCTURES

(75) Inventors: Walter J. Zubrzycki; Gregory A. Vawter; Andrew A. Allerman, all of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/596,028

(22) Filed: Jun. 15, 2000

(51) Int. Cl.[7] ............................................. H01L 21/00
(52) U.S. Cl. ........................... 438/32; 438/22; 438/29; 438/45; 438/46; 438/47; 438/962
(58) Field of Search .............................. 438/32, 29, 45, 438/46, 47, 962, 22

(56) References Cited

U.S. PATENT DOCUMENTS

| 4,983,543 | A | * | 1/1991 | Sato et al. ................... 437/192 |
| 5,394,429 | A | * | 2/1995 | Yamada et al. ............... 372/96 |
| 5,909,614 | A | * | 6/1999 | Krivoshlykov ............... 436/29 |

FOREIGN PATENT DOCUMENTS

EP          0-359-109 A   *   3/1990

* cited by examiner

Primary Examiner—Vu A. Le
Assistant Examiner—Pho Luu
(74) Attorney, Agent, or Firm—Brian W. Dodson

(57) ABSTRACT

A new class of fabrication methods for embedded distributed grating structures is claimed, together with optical devices which include such structures. These new methods are the only known approach to making defect-free high-dielectric contrast grating structures, which are smaller and more efficient than are conventional grating structures.

20 Claims, 4 Drawing Sheets

2a)

2b)

2c)

3a)

3b)

3c)

4a)

4b)

EMBEDDED HIGH-CONTRAST DISTRIBUTED GRATING STRUCTURES

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to new methods of semiconductor device fabrication, and more particularly to methods to fabricate high-contrast distributed grating structures and semiconductor devices comprising such structures.

BACKGROUND OF THE INVENTION

Wavelength-selective filters and mirrors are an integral component in photonic integrated circuits and other photonic devices. Applications include integrated laser sources, waveguide couplers, wavelength tunable lasers, resonant filters, modulators, and wavelength-division-multiplexing systems. Such wavelength-selective components and devices are often implemented through the action of a distributed grating structure.

A distributed grating structure is typically a planar periodic arrangement of high and low refractive index linear elements (square rods, in the simplest implementation), so positioned as to interact with the optical signal to be processed. This interaction can be direct, or through evanescent wave interactions.

A working optical device will require, in addition to the distributed grating structure, some means of insuring that the optical mode or modes of interest are so directed or confined that they interact with the distributed grating structure in the desired fashion. This means will often include a waveguide, or waveguide-like structure, a choice particularly suited to integrated optics applications. Common implementations will involve a ridge waveguide located on the top or bottom of the distributed grating structure. Other possibilities include structures to produce planar confinement of incident light, and optical elements which direct the light to pass near or to scatter from the distributed grating structure. These choices are made with regard to the device being designed, and do not significantly alter the distributed grating structure, save in detail.

The periodic interaction contributes to constructive interference for the desired action for some frequencies, and to destructive interference for other frequencies. Because the length of the grating can be quite large, such devices can differentiate between optical wavelengths which are differ only slightly. For example, semiconductor lasers having an optical cavity based on distributed grating structures have been reported with a spectral linewidth as small as 25 kHz, while a wavelength range as large as 5% of the lasing wavelength is simultaneously achieved.

Previous fabrication methods will be described in the context of the InAlGaAs III-V semiconductor alloy system, although distributed grating structures have been applied in other systems. There are two main approaches toward such fabrication in the literature. The first approach makes a filled distributed grating, that is, one where both material components of the grating are solids, and those components are in intimate contact at the boundaries between the grating elements.

To form such filled distributed gratings, one applies a layer of AlGaAs at the level where the grating is desired within the device structure. The thickness of the grating is usually the same as that of the AlGaAs layer. A grating structure is then patterned on the surface of the AlGaAs layer, and is transferred to the layer by etching. Following the etching process, a layer of GaAs, or of AlGaAs with a smaller Al content, is epitaxially regrown over the etched grating layer. Epitaxial regrowth is important for most distributed grating applications, to limit the density of structural defects, which can both scatter light and can provide recombination centers for charge carriers within the device.

When additional device structures are fabricated, the result is a device with a planar grating having alternating regions with two refractive indices—that of the AlGaAs layer, and that of the GaAs filling. These materials are limited to a low reflective index contrast (hereafter called simply a low-contrast grating structure), with the maximum contrast (ratio of higher to lower refractive index) being about 1.15 for all lattice-matched semiconductor material systems. As a result, rather long distributed gratings have to be used in practical optical devices. For example, a length much greater than 100 microns is required for laser mirrors—a requirement which greatly increases the required footprint of the laser. However, one benefit of the low-contrast filled distributed grating structures is that the interfaces between the individual grating elements and the high refractive index layers are relatively benign with respect to scattering, diffraction, and other mechanisms whereby the optical mode of interest can be disrupted. Since the grating structure is buried, diffraction losses are also quite small.

A more recent approach aims to obtain high-contrast unfilled distributed grating structures by using air as the second grating material. These are often called surface gratings, and are formed by growing a suitable dielectric layer, then defining and etching a pattern of deep open trenches in the surface of that layer. The trenches must be quite deep so that the optical mode of interest does not strongly interact with the trench's open ends, the result of which would be large diffraction and scattering losses. Alternately, very shallow trenches can be formed. Such structures will have small diffraction and scattering losses, but will also exhibit weak coupling coefficients to the optical modes. As a result, shallow structures are not very effective at reducing device footprints.

Dielectric contrast on the order of 3–5 can be attained with surface gratings fabricated in conventional semiconductors, with larger values being possible if special materials are used. Such high-contrast deep grating structures can be effective for laser cavities in lengths as small as 5 microns or less.

Although there have been several demonstrations of operating optical devices using high-contrast unfilled distributed grating structures, there remain a multitude of practical problems in their adoption for production devices. At a fundamental level, the open upper surface of the grating structure insures large scattering losses and a decrease of optical confinement. Deep grooves are needed to minimize the diffraction losses at the surface. In addition, efficient gratings require a square-wave shape with vertical and very deep sidewalls and squared corners. This shape is extremely difficult to form, requiring electron-beam lithography and a highly anisotropic etching technique.

Further, the optical mode being processed in a device possessing an unfilled surface grating must be coupled into an air gap before it can be further coupled into a waveguide. This requirement adds considerable diffraction loss and structural complexity. Therefore, despite the dramatic improvement in device footprint size which can be obtained using unfilled surface gratings, such devices remain primarily laboratory research tools.

There is a clear need for high-contrast distributed grating structures which are straightforward to fabricate, allow similar reductions in device footprint size as do the unfilled surface gratings, and which minimize the deleterious effects of the imperfect gratings resulting from any potential fabrication processes. The instant invention seeks to address and largely solve this need.

SUMMARY OF THE INVENTION

The present invention is of a new class of methods to fabricate embedded (or buried) filled distributed grating structures. These methods involve the lateral oxidation of buried grating elements, thereby dramatically lowering their dielectric constant, and allowing high-contrast buried gratings to be made. Such gratings allow very small and highly efficient wavelength-selected optical devices to be routinely fabricated.

DETAILED DESCRIPTION

It is useful to collect a set of special definitions which will be used in the specification and in the attached claims.

Embedded distributed grating structure—a distributed grating structure such that all interfaces between the grating elements are confined vertically between a top and a bottom high-refractive index layer.

High-contrast—a structure having two different dielectric materials, said materials having refractive indices which form a ratio of at least 1.5.

AlAs—The term AlAs will be used to describe aluminum arsenide, and also any III-V semiconductor alloy in which the Group-III composition is at least 85% aluminum, and in which the Group-V composition is at least 85% arsenic.

GaAs—The term GaAs will be used to describe gallium arsenide, and also any III-V semiconductor alloy in which the Group-III composition is at least 85% gallium, and in which the Group-V composition is at least 85% arsenic.

Oxidizable grating material—Any material which oxidizes rapidly enough compared to the material of the top and bottom high refractive index layers for the instant process to be useful.

Figure 1:
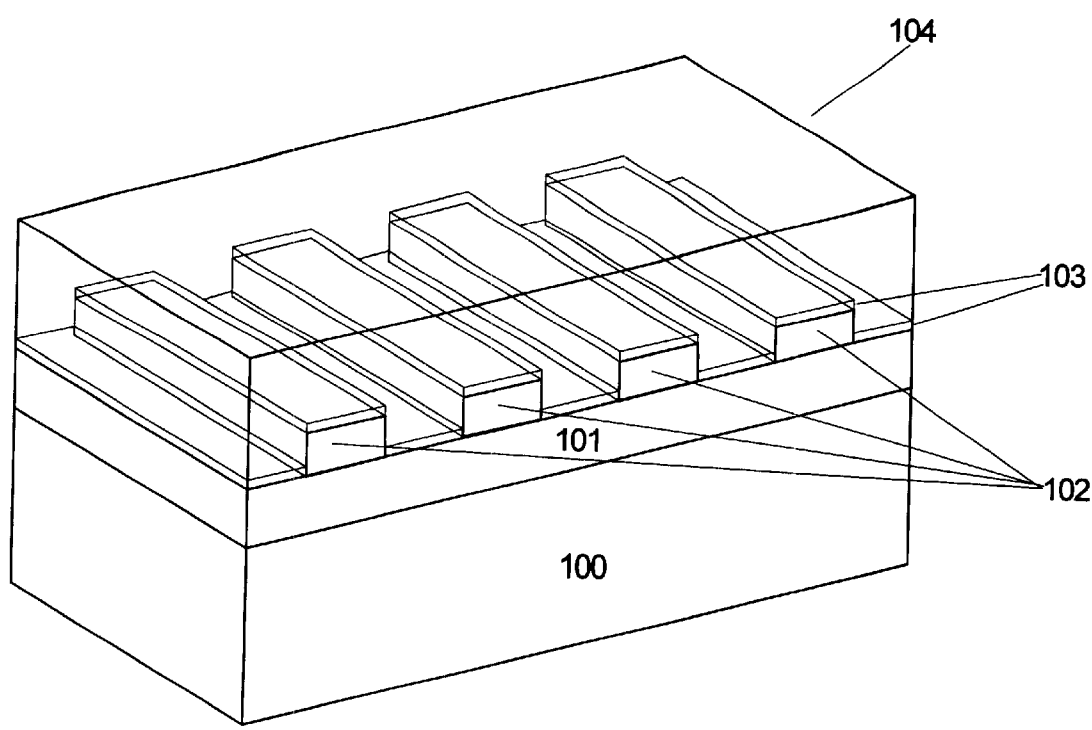
FIG. 1. Schematic illustration of an embedded grating structure.

A semiconductor structure fabricated in accord with the process of the instant invention is shown in FIG. 1. For simplicity a complete semiconductor device is not shown, only the embedded filled distributed grating structure being shown. Also, the III-V semiconductors AlAs and GaAs will be used in this example—that use is not intended to limit the scope of the instant invention.

A GaAs bottom high refractive index layer 101 is positioned atop substrate 100. Substrate 100 can also be of GaAs, although this is not a requirement. Grating elements 102, made of oxidized AlAs, are formed atop bottom high refractive index layer 101. Their dimensions, shape, and spacing is determined, using well-known optical principles, by the optical interactions desired of the completed structure.

The use of GaAs and AlAs is particularly felicitous, as the almost total lack of lattice mismatch between these materials makes defect-free epitaxial growth of the grating structure relatively easy. This allows such structures to be used in regions where device charge carriers also travel, thereby increasing the range of application of such grating structures. For example, distributed feedback lasers become practical designs.

A thin (~50 Å) layer 103 of GaAs is grown atop the exposed top surface of bottom high refractive index layer 101 and the top surfaces of the grating elements 102. This is to facilitate the regrowth process which produces the GaAs upper high refractive index layer 104.

The final structure has a filled embedded distributed grating structure with a refractive index contrast of about 2.2. It can be fabricated, using the instant invention, essentially defect-free at the macroscopic (optical) level and at the level of the crystal structure. The use of GaAs and AlAs in this example is not intended to limit the scope of this invention. The individual growth, lithographic, and etching processes called for in the process are known to one skilled in the art.

Figure 2:
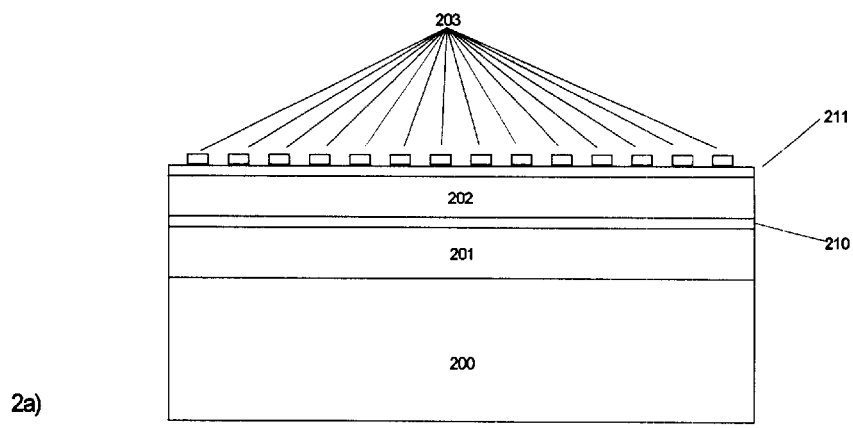
FIG. 2. Process stages in the formation of an embedded grating structure.
Figure 2:
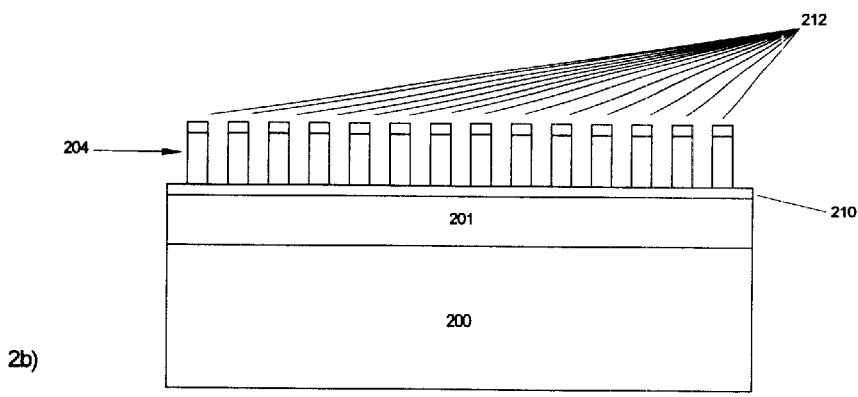
Figure 2:
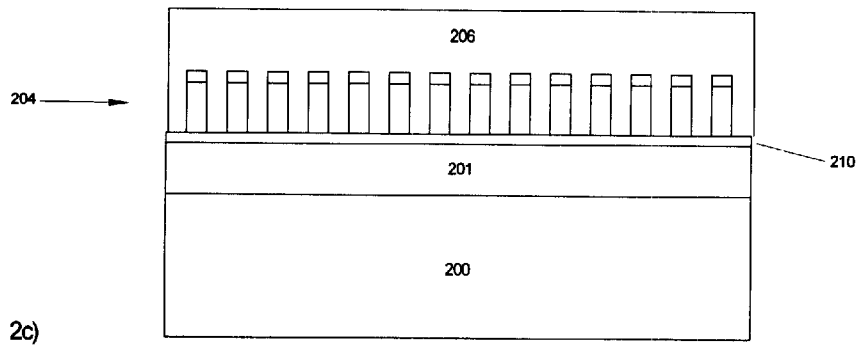

A process according to the instant invention to fabricate filled embedded distributed grating structures is shown in FIG. 2. A GaAs bottom high refractive index layer 201 is grown on top of a GaAs substrate 200, followed by growth of an AlAs grating layer 202. If the bottom high refractive index layer 201 is not literally GaAs, then subsequent regrowth can be facilitated by growing a thin layer 210 of stoichiometric GaAs before growing the grating layer 202. Layer 210 can also act as a stop etch layer for the grating layer etch to be described, thereby allowing the height of the grating to be precisely defined.

A GaAs cap layer 211 can then be grown on top of grating layer 202. This cap layer prevents the grating layer from oxidizing during handling, and also provides a surface on which GaAs regrowth can be easily initiated. FIG. 2a shows the resulting structure after an etch mask layer 203 has been applied and patterned.

The AlAs grating layer 202 is etched through etch mask 203 using an appropriate etching technique, thereby forming grating elements 204 and GaAs grating top caps 212. If the grating elements 204 are intended to have a rectangular cross section, it is important that the etching technique used be anisotropic and compatible with formation of vertical sidewalls. In many material systems, reactive ion etching will serve this purpose. In some cases, a suitable anisotropic chemical etch will exist. Other cross section shapes can be formed using techniques known in the art. Etching the grating layer 202 results in the structure shown in FIG. 2b.

FIG. 2c shows the embedded grating structure following growth of the GaAs upper high refractive index layer 206. However, at this point the structure is only a low-contrast grating (contrast~1.15). To obtain the desired structures, it is necessary to oxidize the AlAs grating elements 204. Oxidization produces grating elements having relatively low refractive index (~1.6 for AlAs), and hence converts the embedded grating into a high-contrast grating. However, as the grating elements are now embedded between the upper and lower high refractive index layers, and are not accessible to external oxidizing conditions.

Note that the combination of the exposed portions of GaAs cap layer 210 and the GaAs grating top caps 212 provide the basis for regrowth of GaAs upper layer 206. The detailed structure of the grating elements 204 is relatively unimportant to the regrowth process. As a result, an alternate to lateral selective oxidization of grating elements 204 is to oxidize these elements before growing GaAs upper layer 206. The GaAs upper layer is then grown on the exposed GaAs surfaces, eventually merging into one nearly perfect layer.

AlAs is subject to oxidization when exposed to an atmosphere of flowing nitrogen containing water vapor at elevated temperatures. Typical etching conditions are to bubble nitrogen gas through water held at 75–95° C., then to flow this wet nitrogen gas over the structure to be etched, said structure being held at temperatures in the neighborhood of 400–500° C. Under these conditions, AlAs oxidizes so much faster than does GaAs that a phenomenon known as lateral selective oxidization occurs. In lateral selective oxidization, a buried lateral structure which is exposed at an end oxidizes so rapidly that the entire lateral structure can be partially or completely oxidized without doing significant damage to the surrounding structures.

Figure 3:
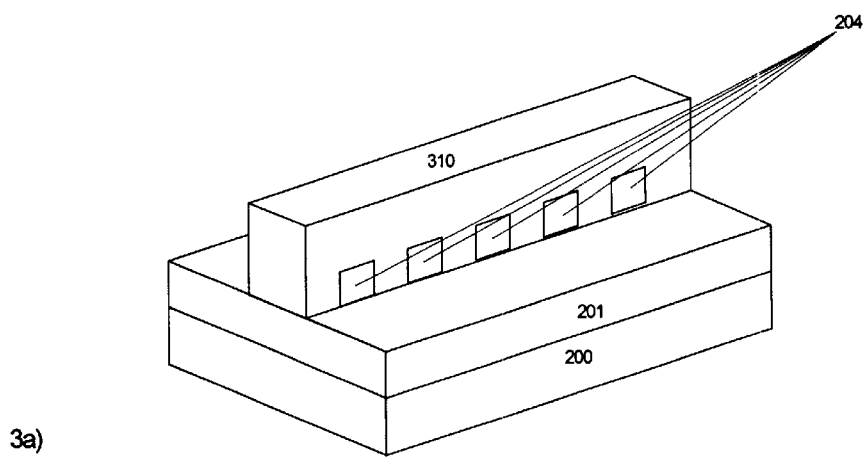
FIG. 3. Routes toward making grating elements available for lateral selective oxidization.
Figure 3:
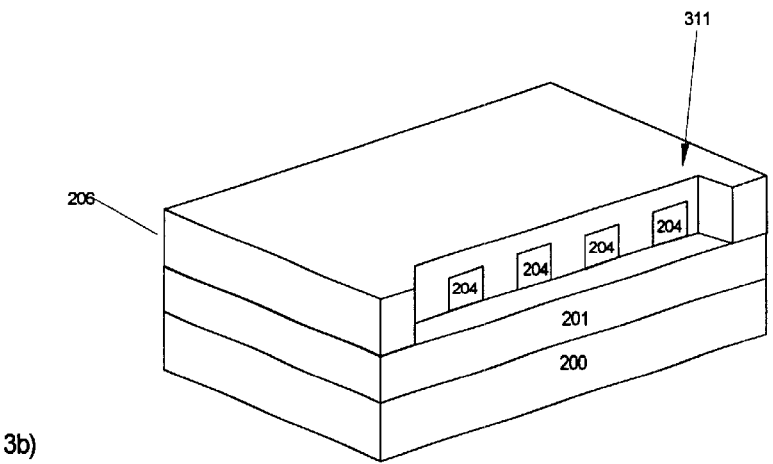
Figure 3:
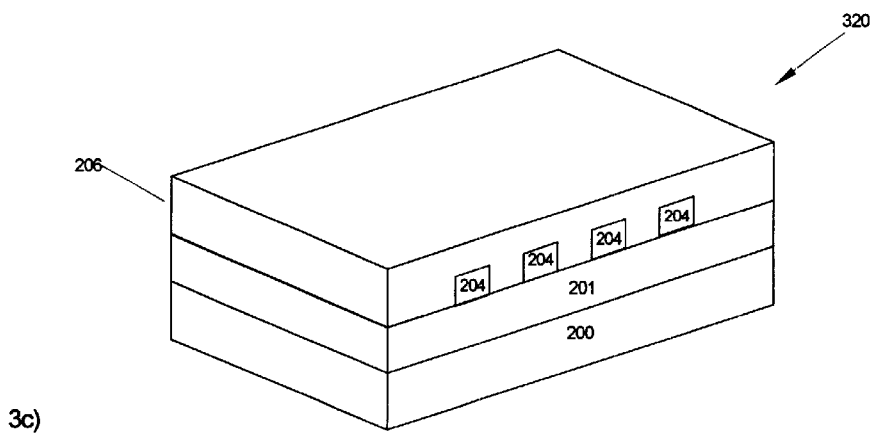

FIG. 3 shows various approaches to rendering the grating structure formed as shown in FIG. 2 susceptible to lateral selective oxidization. FIG. 3a shows the structure resulting from a mesa etch. Here the material around a central ridge 310 is removed by an etching process. The depth of the etching will depend on the purpose intended for the grating structure, but must be deep enough that the AlAs grating elements 204 can be laterally oxidized. Such structures are particularly useful for distributed Bragg reflector lasers, as the ridge can also function as an optical waveguide.

FIG. 3b shows an alternate approach toward rendering the grating structure susceptible to lateral selective oxidization. Here a trench 311 is etched into the upper high refractive index layer, thereby exposing the AlAs grating elements 204.

FIG. 3c shows another approach, which is simply to dice the devices being fabricated before lateral selective oxidization. The individual dice 320 have open sides, which expose the AlAs grating elements 204 to oxidization.

Once the grating elements have been exposed, lateral selective oxidization is carried out as described above. At this point further device fabrication can be carried out if required for the intended purpose.

Figure 4:
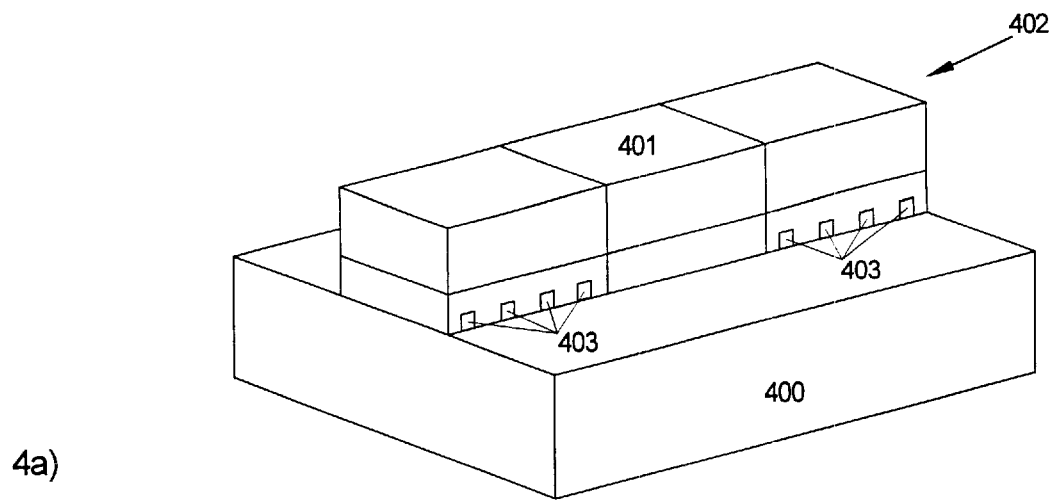
FIG. 4. Schematic illustration of various optical devices comprising embedded high-contrast distributed grating structures.
Figure 4:
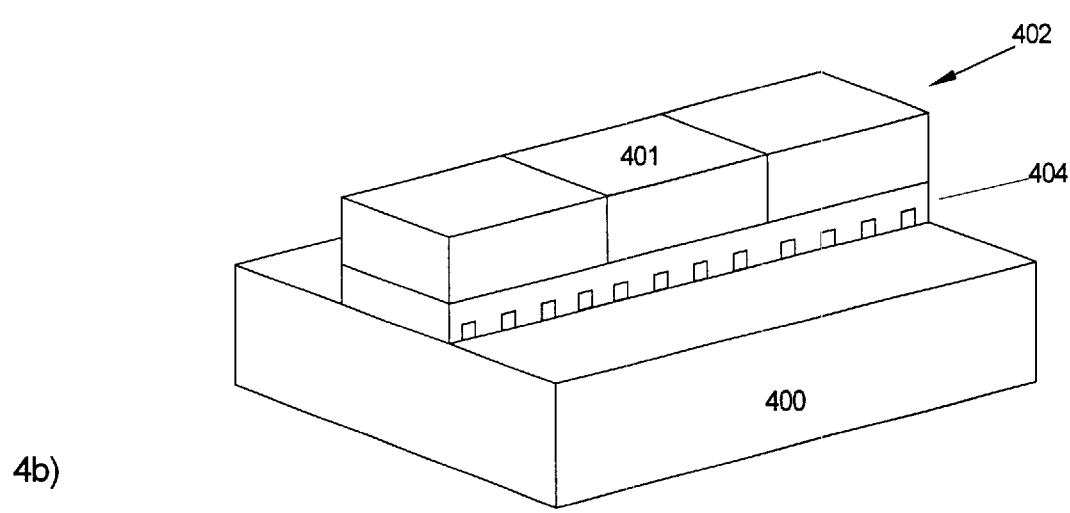

FIG. 4 shows a variety of optical devices which comprise an embedded distributed grating structure according to the instant invention. FIG. 4a shows a pumped excited optical medium 401 in a ridge waveguide 402 atop a substrate 400 containing a pair of embedded distributed grating structures 403. If grating structures 403 designed to be reflective at the emission wavelength of the pumped optical medium, the resulting device can function as a light emitting device or as a laser, depending on the operating characteristics. Alternately, if grating structures 403 are, e.g., optical filters at the operating frequency, the resulting device can function as an optical amplifier.

FIG. 4b shows a similar structure, save that only one grating structure 404 is used, and that grating structure extends under the optical medium. The grating structure 404 functions as a distributed feedback element, again providing filtering and/or reflective properties to the device. The resulting device can again be an optical amplifier, or an optical source.

The specific implementations of the instant invention described above, and the materials used in those implementations, were chosen for purposes of illustrating general features of the structure and function of said invention. Their presentation was not intended to limit the scope of this invention, which is defined by the claims appended hereto.

What is claimed is:

1. A method to fabricate filled embedded distributed optical grating structures, comprising:
   a) growing on a substructure a bottom high refractive index layer;
   b) growing atop said bottom high refractive index layer a grating layer of oxidizable grating material;
   c) forming an optical grating structure into said grating layer of oxidizable grating material;
   d) growing an upper high refractive index layer on top of said optical grating structure;
   e) exposing lateral portions of said optical grating structure; and,
   f) oxidizing the optical grating structure.

2. The method of claim 1, wherein the bottom high refractive index layer and the top high refractive index layer have substantially identical chemical compositions.

3. The method of claim 1, wherein the top high refractive index layer, the bottom high refractive index layer, and the grating layer have mutually epitaxial structures.

4. The method of claim 1, wherein said exposing lateral portions of said optical grating structure is carried out by process steps comprising a mesa etch.

5. The method of claim 1, wherein said exposing lateral portions of said optical grating structure is carried out by process steps comprising opening trenches into the lateral portions of said optical grating structure.

6. The method of claim 1, wherein said exposing lateral portions of said optical grating structure is carried out by process steps comprising dicing the substructure and all layers formed on top of said substructure.

7. The method of claim 1, wherein said oxidization is carried out by process steps comprising exposing at elevated temperature the lateral portions of said optical grating structure to high humidity nitrogen gas.

8. The method of claim 7, wherein said high humidity nitrogen gas is formed by bubbling nitrogen gas through water at a temperature between 75 and 95° C.

9. The method of claim 7, wherein said elevated temperature is between 350 and 550° C.

10. The method of claim 7, wherein said elevated temperature is between 400 and 500° C.

11. The method of claim 1, wherein said oxidizable grating material comprises a III-V semiconductor or a III-V semiconductor alloy.

12. The method of claim 1, wherein said bottom high refractive index layer comprises a III-V semiconductor or a III-V semiconductor alloy.

13. The method of claim 1, wherein said top high refractive index layer comprises a III-V semiconductor or a III-V semiconductor alloy.

14. The method of claim 1, wherein said oxidizable grating material consists essentially of AlAs.

15. The method of claim 14, wherein said grating layer further comprises a thin top coating of essentially stoichiometric GaAs.

16. The method of claim 14, wherein said grating layer further comprises a thin bottom coating of essentially stoichiometric GaAs.

17. The method of claim 14, wherein said grating layer further comprises a thin top and bottom coating of essentially stoichiometric GaAs.

18. The method of claim 1, wherein said top and bottom high refractive index layers consist essentially of GaAs.

19. The method of claim 1, further comprising forming a ridge waveguide atop said top high refractive index layer.

20. A method to fabricate filled embedded distributed optical grating structures, comprising:
   a) growing on a substructure a bottom high refractive index layer;
   b) growing atop said bottom high refractive index layer a grating layer of oxidizable grating material;
   c) forming an optical grating structure into said grating layer of oxidizable grating material;
   d) oxidizing the optical grating structure; and,
   e) growing an upper high refractive index layer on top of said optical grating structure.

* * * * *

UNITED STATES PATENT AND TRADEMARK OFFICE
CERTIFICATE OF CORRECTION

PATENT NO. : 6,365,428 B1
DATED : April 2, 2002
INVENTOR(S) : Zubrzycki et al.

It is certified that error appears in the above-identified patent and that said Letters Patent is hereby corrected as shown below:

<u>Title page,</u>
Item [*] Notice, delete the phrase "by 0 days" and insert -- by 24 days --

Signed and Sealed this

Twelfth Day of October, 2004

JON W. DUDAS
*Director of the United States Patent and Trademark Office*